United States Patent
Kitagawa

(10) Patent No.: US 7,106,562 B2
(45) Date of Patent: Sep. 12, 2006

(54) PROTECTION CIRCUIT SECTION FOR SEMICONDUCTOR CIRCUIT SYSTEM

(75) Inventor: Nobutaka Kitagawa, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 524 days.

(21) Appl. No.: 10/417,112

(22) Filed: Apr. 17, 2003

(65) Prior Publication Data

US 2003/0214773 A1    Nov. 20, 2003

(30) Foreign Application Priority Data

Apr. 19, 2002    (JP) ............... 2002-118253

(51) Int. Cl.
*H02H 9/00* (2006.01)
(52) U.S. Cl. ..................................... 361/56
(58) Field of Classification Search .............. 361/56
See application file for complete search history.

(56) References Cited

U.S. PATENT DOCUMENTS

| | | | | |
|---|---|---|---|---|
| 5,561,577 | A * | 10/1996 | Motley ..................... | 361/56 |
| 6,016,002 | A * | 1/2000 | Chen et al. ................ | 257/546 |
| 6,618,233 | B1* | 9/2003 | Russ et al. ................ | 361/111 |
| 6,768,616 | B1* | 7/2004 | Mergens et al. ............ | 361/56 |
| 6,791,122 | B1* | 9/2004 | Avery et al. ............... | 257/173 |
| 6,898,062 | B1* | 5/2005 | Russ et al. ................ | 361/56 |
| 2002/0089017 | A1* | 7/2002 | Lai et al. .................. | 257/355 |
| 2002/0154463 | A1* | 10/2002 | Mergens et al. ............ | 361/56 |
| 2003/0090845 | A1* | 5/2003 | Ker et al. .................. | 361/56 |

FOREIGN PATENT DOCUMENTS

| | | |
|---|---|---|
| JP | 7-240510 | 9/1995 |
| JP | 9-162303 | 6/1997 |
| JP | 2001-185738 | 7/2001 |

OTHER PUBLICATIONS

U.S. Appl. No. 10/798,402, filed Mar. 12, 2004, Kitagawa.
U.S. Appl. No. 10/800,999, filed Mar. 16, 2004, Kitagawa.
U.S. Appl. No. 10/865,999, filed Jun. 14, 2004, Kojima et al.
U.S. Appl. No. 10/671,585, filed Sep. 29, 2003, Kitagawa.

* cited by examiner

*Primary Examiner*—Ronald Leja
(74) *Attorney, Agent, or Firm*—Oblon, Spivak, McClelland, Maier & Neustadt, P.C.

(57) ABSTRACT

A semiconductor circuit system has first, second, and third external terminals electrically separated from each other. The first external terminal is configured to receive a first power supply voltage in a normal operation. A protection circuit section is provided in the circuit system and includes a rectifier to allow a surge current to pass therethrough. The rectifier has a current passage connected between a specific terminal connected to a protection target and the third external terminal. The protection circuit section further includes a first PMOS transistor configured to trigger the rectifier, based on a surge voltage inputted into the second external terminal. The first PMOS transistor has a current passage connected between the second external terminal and a base of the NPN transistor. The first PMOS transistor has a gate connected to the first external terminal.

13 Claims, 11 Drawing Sheets

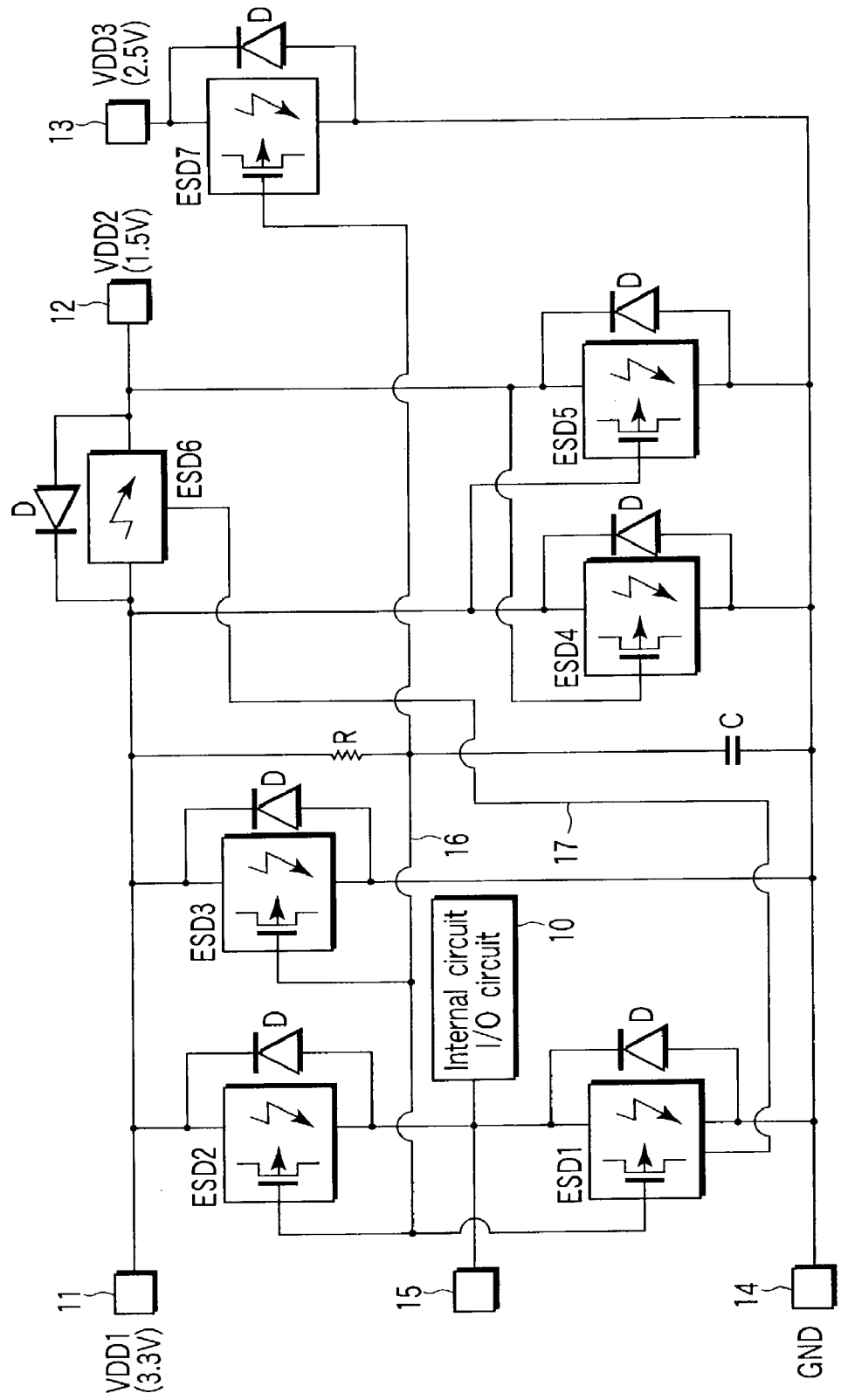
F I G. 1

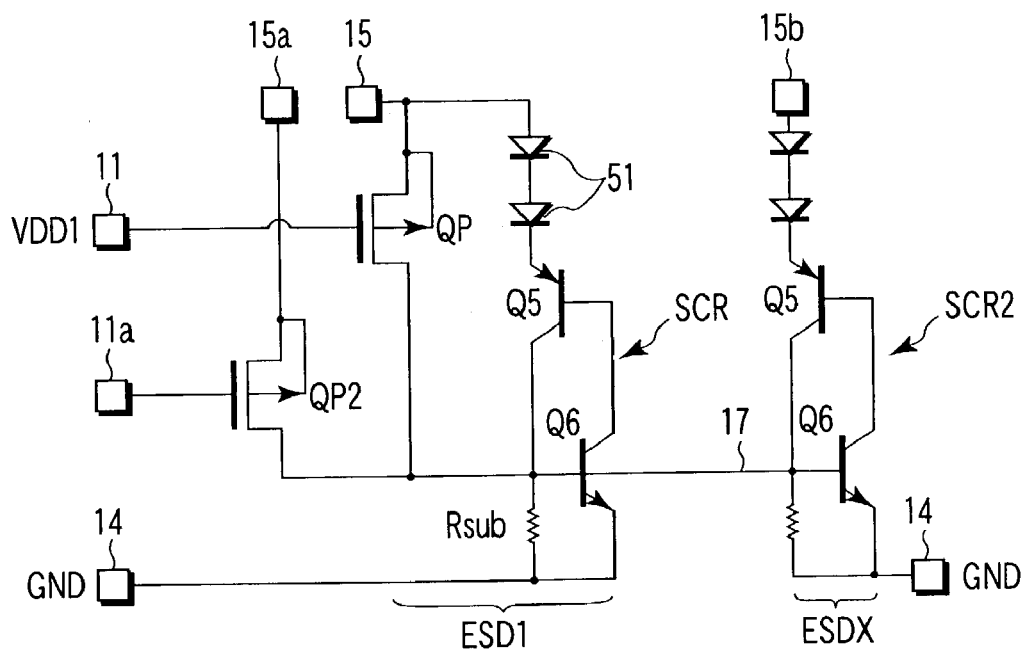
F I G. 7
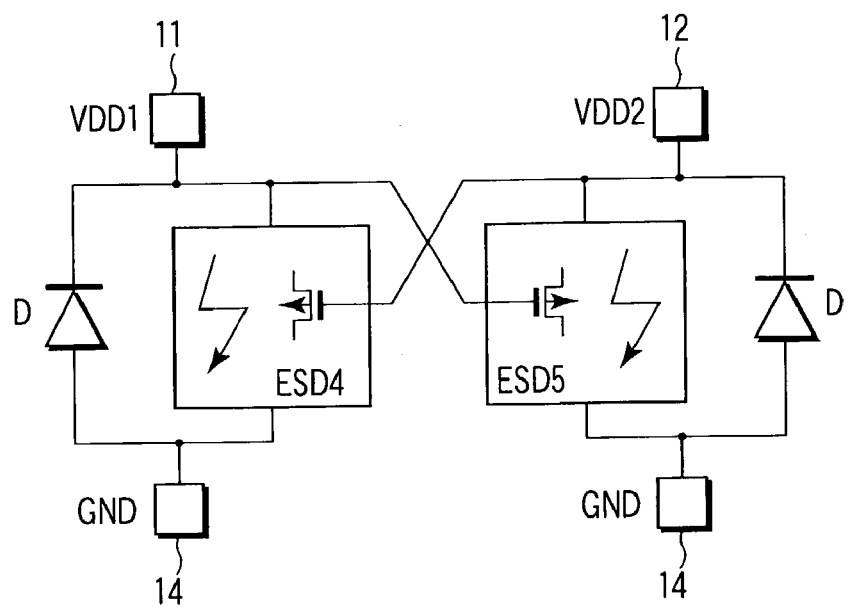
F I G. 9

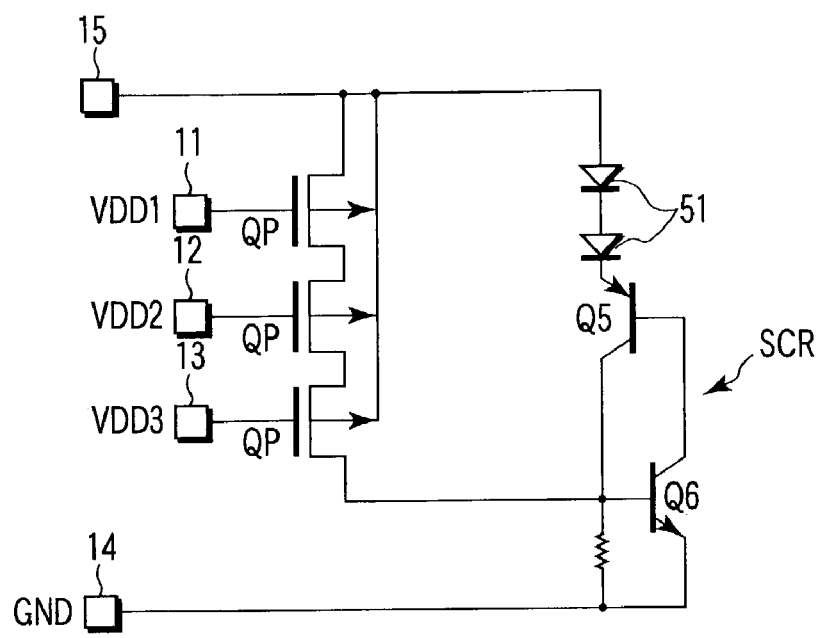
F I G. 8A
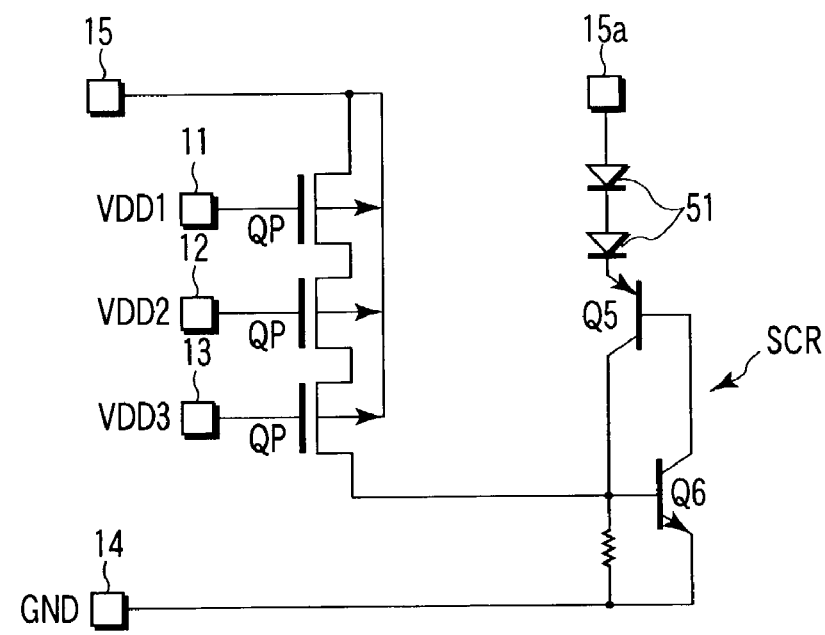
F I G. 8B

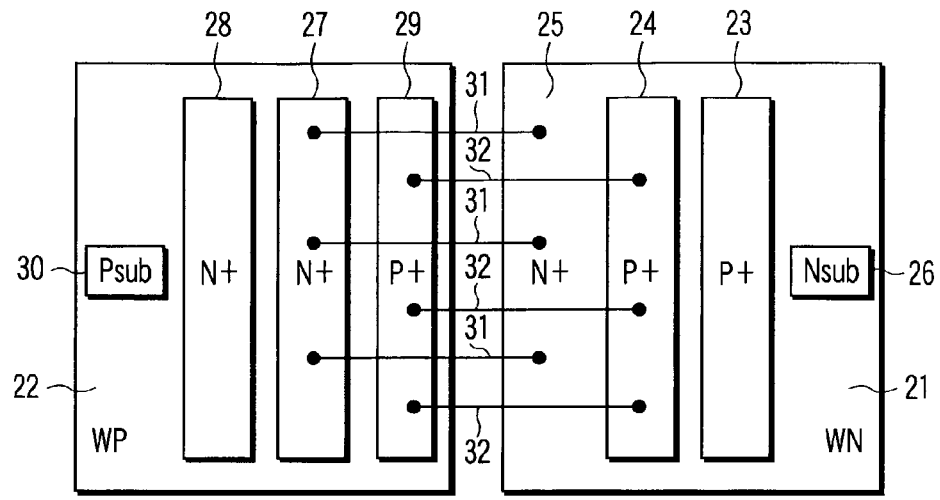
F I G. 12
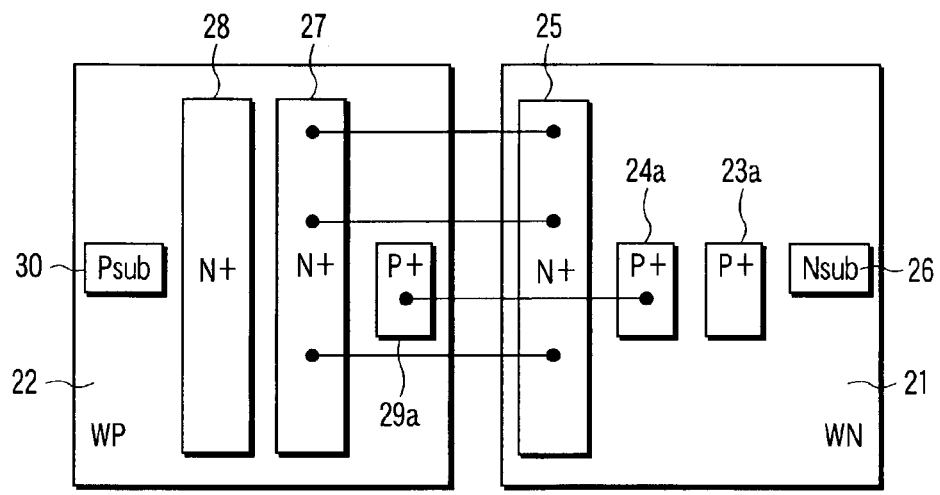
F I G. 13
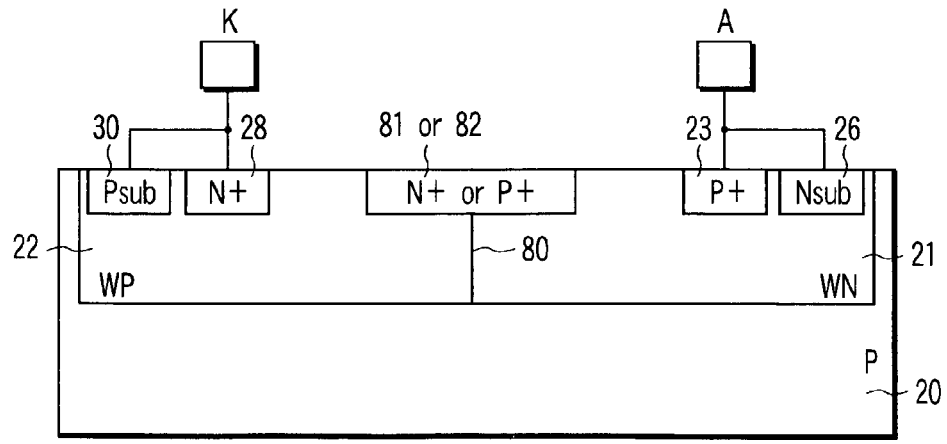
F I G. 14

PROTECTION CIRCUIT SECTION FOR SEMICONDUCTOR CIRCUIT SYSTEM

CROSS-REFERENCE TO RELATED APPLICATIONS

This application is based upon and claims the benefit of priority from the prior Japanese Patent Application No. 2002-118253, filed Apr. 19, 2002, the entire contents of which are incorporated herein by reference.

BACKGROUND OF THE INVENTION

1. Field of the Invention

The present invention relates to a protection circuit section for protecting a protection target in a semiconductor circuit system from a surge. Typically, the protection circuit section employs a silicon controlled rectifier (SCR) to protect a protection target from electro-static discharge (ESD). For example, the protection circuit section is applied to a CMOS-LSI of the low power supply voltage type.

2. Description of the Related Art

There is a known technique in which an ESD protection circuit is connected to the input circuit or output circuit of a CMOS-LSI to protect it from ESD breakdown. The ESD protection circuit employs a protection element, such as a diode, transistor, or SCR.

Generally, in an ESD protection circuit employing an SCR, the operation voltage of the SCR is high. When such a circuit is applied to a micro-patterned CMOS-LSI whose operation power supply is low in voltage, the SCR has to be triggered with a low voltage trigger so as to protect a MOS transistor having a low gate breakdown voltage. Under the circumstances, an example in which an ESD protection circuit employing an SCR is applied to a CMOS-LSI of the low power supply voltage type is disclosed in "A Gate-Coupled PTLSCR/NTLSCR ESD Protection Circuit for Deep-Submicron Low-Voltage CMOS IC's 1", IEEE JOURNAL OF SOLID-STATE CIRCUITS, VOL. 32, NO. 1, JANUARY 1997.

FIG. 17 is an equivalent circuit diagram showing the main part of an ESD protection circuit connected to the input circuit of a CMOS-LSI, disclosed in the publication described above. In this example (Prior Art 1), the ESD protection circuit employs an LVTSCR (Low-Voltage Triggered lateral SCR) as the SCR.

As shown in FIG. 17, a first ESD protection circuit 121 is connected between an input pad PAD, which is connected to internal circuits, and a VDD node to be supplied with a power supply potential VDD. A second ESD protection circuit 122 is connected between the input pad PAD and a ground potential VSS (GND).

In the first ESD protection circuit 121, the current passage between the anode and cathode of the LVTSCR1 used as a first SCR is connected between the VDD node and input pad PAD. The LVTSCR1 is arranged such that the base and collector of a PNP transistor Q1 are connected to the collector and base of an NPN transistor Q2, respectively. The emitter of PNP transistor Q1 comes to the anode, and the emitter of the NPN transistor Q2 comes to the cathode.

The current passage between the source S and drain D of a PMOS transistor Mp1 having a thin gate oxide film is connected between the VDD node and NPN transistor Q2. The gate G of the PMOS transistor Mp1 is connected to the VDD node.

A well layer resistance Rw1 exists from the base of the PNP transistor Q1 and the collector of the NPN transistor Q2 (N-Well) to the VDD node. A well layer resistance Rw2 exists between the emitter of the NPN transistor Q2 and the input pad PAD. A substrate resistance Rsub1 exists from the collector of the PNP transistor Q1 and the base of the NPN transistor Q2 (p-sub) to the GND.

In the second ESD protection circuit 122, the current passage between the anode and cathode of the LVTSCR2 used as a second SCR is connected between the input pad PAD and the GND. The LVTSCR2 is arranged such that the base and collector of a PNP transistor Q3 are connected to the collector and base of an NPN transistor Q4, respectively. The emitter of PNP transistor Q3 comes to the anode, and the emitter of the NPN transistor Q4 comes to the cathode.

The current passage between the drain D and source S of a NMOS transistor Mn1 having a thin gate oxide film is connected between the base of the PNP transistor Q3 and the emitter of the NPN transistor Q4. The gate G of the NMOS transistor Mn1 is connected to the GND.

A well layer resistance Rw3 exists from the base of the PNP transistor Q3 and the collector of the NPN transistor Q4 (N-Well) to the VDD node. A resistance Rw4 exists between the emitter of the NPN transistor Q4 and the GND. A substrate resistance Rsub2 exists between the base of the NPN transistor Q4 (the substrate region of the NMOS transistor TN) and the GND.

FIG. 18 is a sectional view schematically showing the LVTSCR2 as a representative of the LVTSCR1 and LVTSCR2 shown in FIG. 17.

As shown in FIG. 18, an N-well layer (N-Well) 131 is formed in the surface of a P-substrate (P-Substrate) 130. A $P^+$-region (the emitter region of the PNP transistor Q3) 132 and an $N^+$-region (the lead-out region of the N-well layer) 133 are formed adjacent to each other in the surface of the N-well layer (the base region of the PNP transistor Q3) 131. The $P^+$-region 132 and $N^+$-region 133 come to the anode of the LVTSCR (Anode).

An $N^+$-region (the collector region of the NPN transistor Q4 and the drain region of the NMOSFET) 135 is formed in the surface including the interface between the N-well layer 131 and the P-substrate (the collector region of the PNP transistor Q3 and the base region of the NPN transistor Q4) 130. A device isolation region 134 is formed between the $N^+$-region 135 and $P^+$-region 132.

An $N^+$-region (the emitter region of the NPN transistor Q4 and the source region of the NMOS transistor Mn1) 136 is formed adjacent to the $N^+$-region 135 in the surface of the P-substrate 130. The $N^+$-region 136 comes to the cathode of the LVTSCR (Cathode).

The gate electrode 137 of the NMOS transistor Mn1 is disposed, through a thin gate oxide film, on a channel region between the two $N^+$-regions 135 and 136. The gate electrode 137 is connected to the cathode (the $N^+$-region 136).

In the LVTSCR2 described above, both the PNP transistor Q3 and NPN transistor Q4 use the junction between the P-substrate 130 and N-well layer 131. It is specific that the drain region 135 of the NMOSFET is formed on a part of the junction.

The second ESD protection circuit 122 shown in FIG. 17, which employs the LVTSCR2 with the arrangement described above, operates as follows, when the input pad PAD receives a positive surge voltage. Specifically, if a voltage higher than a snap-back breakdown voltage is applied to the LVTSCR2 due to the surge voltage, the LVTSCR2 is turned on, using the snap-back current as a base current. As a consequence, the surge current is discharged to the GND, thereby protecting the input gate of the input circuit. However, if the voltage applied to the LVTSCR2, which is higher than a snap-back breakdown voltage, is higher than the gate breakdown voltage of the NMOS transistor Mn1, the internal circuits may be damaged by the surge voltage input.

FIG. 19 is an equivalent circuit diagram showing the main part of another ESD protection circuit, disclosed in the publication described above. In this example (Prior Art 2), the ESD protection circuit employs a lateral SCR, which uses a gate coupling technique and can be triggered with a still lower voltage.

As shown in FIG. 19, there is a first ESD protection circuit 151 different from the first ESD protection circuit 121 shown in FIG. 17, in the following points (1) to (4).

(1) In place of LVTSCR1 shown in FIG. 17, one PTLSCR (PMOS-Triggered lateral SCR) is used.

(2) The current passage between the source and drain of a PMOS transistor Mp1 is connected in parallel between a VDD node and the gate node of the PTLSCR (the base of an NPN transistor Q2).

(3) A resistance element Rp is connected between the VDD node and the gate of the PMOS transistor Mp1.

(4) A capacitance element Cp is connected between the gate of the PMOS transistor Mp1 and an input pad PAD.

Furthermore, there is a second ESD protection circuit 152 different from the second ESD protection circuit 122 shown in FIG. 17, in the following points (1) to (4).

(1) In place of LVTSCR2 shown in FIG. 17, one NTLSCR (NMOS-Triggered lateral SCR) is used.

(2) The current passage between the drain and source of an NMOS transistor Mn1 is connected in parallel between the gate node of the NTLSCR (the base of a PNP transistor Q3) and a cathode (the emitter of an NPN transistor Q4).

(3) A capacitance element Cn is connected between an input pad PAD and the gate of the NMOS transistor Mn1.

(4) A resistance element Rn is connected between the gate of the NMOS transistor Mn1 and a GND.

In the arrangement described above, the first ESD protection circuit 151 employing the PTLSCR operates, when the input pad PAD receives a negative surge voltage, such that the PMOS transistor Mp1 is transitionally turned on and inputs a trigger into the PTLSCR. As a consequence, the surge current flows to the VDD node, thereby protecting the input gate of the input circuit. In this case, the PMOS transistor Mp1 is turned back to the off-state in a predetermined delay time determined by the resistance element Rp and capacitance element Cp.

On the other hand, the second ESD protection circuit 152 employing the NTLSCR operates, when the input pad PAD receives a positive surge voltage, such that the NMOS transistor Mn1 is transitionally turned on and inputs a trigger into the NTLSCR. As a consequence, the surge current flows to the GND, thereby protecting the input gate of the input circuit. In this case, the NMOS transistor Mn1 is turned back to the off-state in a predetermined delay time determined by the capacitance element Cn and resistance element Rn.

As described above, the conventional ESD protection circuit employing an SCR pulls the trigger by utilizing a transitional potential change caused when an input pad connected to the SCR receives a surge voltage. This does not necessarily provide a good protection characteristic. When an ESD protection circuit employing an SCR is applied to an LSI having a low power supply voltage, it is preferable to realize a good protection characteristic with a low voltage trigger, thereby improving the reliability.

BRIEF SUMMARY OF THE INVENTION

According to an aspect of the present invention, there is provided a protection circuit section provided in a semiconductor circuit system, which has first, second, and third external terminals electrically separated from each other, the first external terminal being configured to receive a first power supply voltage in a normal operation, the protection circuit section comprising:

a rectifier configured to allow a surge current to pass therethrough, the rectifier including a PNP transistor and an NPN transistor combined to equivalently form a thyristor, and the rectifier having a current passage connected between a specific terminal connected to a protection target and the third external terminal; and a first PMOS transistor configured to trigger the rectifier, based on a surge voltage inputted into the second external terminal, the first PMOS transistor having a current passage connected between the second external terminal and a base of the NPN transistor, the first PMOS transistor having a source and a channel region connected to each other, and the first PMOS transistor having a gate connected to the first external terminal.

BRIEF DESCRIPTION OF THE SEVERAL VIEWS OF THE DRAWING

FIG. 1 is a circuit diagram showing a CMOS-LSI or semiconductor circuit system, which includes a plurality of protection circuit sections according to several embodiments of the present invention;

FIG. 7 is an equivalent circuit diagram showing still another modification of the protection circuit section shown in FIG. 4;

FIG. 8A is an equivalent circuit diagram showing still another modification of the protection circuit section shown in FIG. 4;

FIG. 8B is an equivalent circuit diagram showing still another modification of the protection circuit section shown in FIG. 4;

FIG. 9 is an equivalent circuit diagram showing the fourth ESD protection circuit ESD4 and the fifth ESD protection circuit ESD5 along with diodes for allowing a current to flow in the reverse direction, which are shown in FIG. 1;

FIG. 12 is a plan view schematically showing an example of the plan view pattern of the SCR shown in FIG. 11A;

FIG. 13 is a plan view schematically showing a modification of the plan view pattern of the SCR shown in FIG. 12;

FIG. 14 is a sectional view schematically showing a modification of the sectional structure of the SCR shown in FIG. 11A;

DETAILED DESCRIPTION OF THE INVENTION

Figure 2:
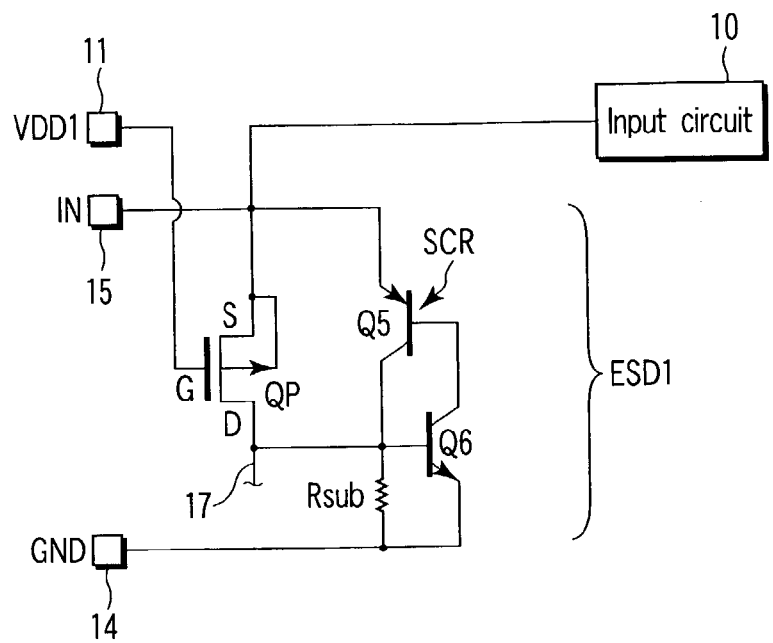
FIG. 2 is an equivalent circuit diagram showing a protection circuit section according to an embodiment of the present invention, which corresponds to the first ESD protection circuit ESD1 shown in FIG. 1.

Embodiments of the present invention will now be described with reference to the accompanying drawings. In the following description, the constituent elements having substantially the same function and arrangement are denoted by the same reference numerals, and a repetitive description will be given only when necessary.

FIG. 1 is a circuit diagram showing a CMOS-LSI or semiconductor circuit system, which includes a plurality of protection circuit sections according to several embodiments of the present invention. In these embodiments, a plurality of pads are formed on a single semiconductor chip (LSI chip). When the chip is packaged, these pads are connected to outer connection terminals (such as pins, bumps, or electrodes).

Furthermore, in these embodiments, the protection circuit sections comprise ESD protection circuits, in which a rectifier formed of an SCR (Silicon Controlled Rectifier) is used as a protection element. It should be noted that "SCR" denotes a typical name of a rectifier, where the protection circuit sections are formed on a silicon substrate. In other words, a rectifier used as a protection element in the protection circuit sections may be formed of any rectifier, as long as it includes a PNP transistor and NPN transistor combined to equivalently form a thyristor, without reference to the semiconductor material of the substrate.

As shown in FIG. 1, the semiconductor circuit system includes an internal circuit (the input circuit or output circuit) 10 of a CMOS-LSI, and a plurality of pads (external terminals) 11 to 15. The VDD1 pad 11 is designed to be supplied with a first power supply potential VDD1 (for example, 3.3V). The VDD2 pad 12 is designed to be supplied with a second power supply potential VDD2 (for example, 1.5V). The VDD3 pad 13 is designed to be supplied with a third power supply potential VDD3 (for example, 2.5V). The GND pad 14 is designed to be supplied with a ground potential GND. The signal pad 15 is connected to the internal circuit 10.

FIG. 1 shows seven ESD protection circuits ESD1 to ESD7. Each of the ESD protection circuits ESD1 to ESD5, and ESD7 has an SCR used as a protection element, and a PMOS transistor QP for inputting a trigger into the SCR. The ESD protection circuit ESD6 has an SCR, which is to be supplied with a trigger from its own PMOS transistor QP, and/or a thyristor action signal from the ESD protection circuit ESD1. A diode D is connected in parallel with each of the SCR of the ESD protection circuits ESD1 to ESD7. The diode D functions as a rectifier that receives a forward bias, when the corresponding SCR receives a reverse voltage, so that it allows current to flow in the reverse direction relative to the SCR.

The first ESD protection circuit ESD1 and diode D combination is connected between the signal pad 15 and GND pad 14. The second ESD protection circuit ESD2 and diode D combination is connected between the VDD1 pad 11 and signal pad 15. The third ESD protection circuit ESD3 and diode D combination is connected between the VDD1 pad 11 and GND pad 14. The fourth ESD protection circuit ESD4 and diode D combination is connected between the VDD1 pad 11 and GND pad 14. The fifth ESD protection circuit ESD5 and diode D combination is connected between the VDD2 pad 12 and GND pad 14. The sixth ESD protection circuit ESD6 and diode D combination is connected between the VDD1 pad 11 and VDD2 pad 12. The seventh ESD protection circuit ESD7 and diode D combination is connected between the VDD3 pad 13 and GND pad 14.

The gate of the PMOS transistor QP for inputting a trigger to the SCR of each of the ESD protection circuits ESD1 to ESD7 is connected to a node, which is set at a power supply potential when the CMOS-LSI is in the normal operation. However, that is when the node is set at GND (for example, before the CMOS-LSI is used), an inputted surge voltage has to be handled by the ESD protection circuit. The node is not a node that the anode or cathode of the corresponding SCR is connected to.

Specifically, the SCR of each of the fourth ESD protection circuit ESD4, and fifth ESD protection circuit ESD5 is supplied with a trigger from the PMOS transistor QP provided in the corresponding protection circuit. The gates of these PMOS transistors QP are mutually connected to their power supply pads (VDD1 pad 11 and VDD2 pad 12).

The SCR of each of the second ESD protection circuit ESD2, third ESD protection circuit ESD3, and seventh ESD protection circuit ESD7 is also supplied with a trigger from the PMOS transistor QP provided in the corresponding protection circuit. The gate of this PMOS transistor QP is connected to the output node of an integrator circuit thorough a trigger bias line 16. The integrator circuit is arranged such that a resistance element R and capacitance element C are connected in series between the highest potential power supply pad (VDD1 pad 11) and GND pad 14.

On the other hand, the SCR of the sixth ESD protection circuit ESD6 is arranged, such that it can be supplied with a trigger from the PMOS transistor QP provided in another ESD protection circuit (for example, the first ESD protection circuit ESD1 disposed on a path through which the same surge current as that to the sixth ESD protection circuit ESD6 flows). More specifically, as described later, the drain of the PMOS transistor QP provided in the first ESD protection circuit ESD1 is connected to the gate of the NPN transistor of the SCR provided in the sixth ESD protection circuit ESD6 through a trigger supply line 17.

In the arrangement described above, when an inputted surge voltage has to be handled by the ESD protection circuit, the power supply pads 11 to 13, trigger bias line 16, and trigger supply line 17 are not yet supplied with normal power supply potentials, but are set at GND in general.

When the signal pad 15 receives a positive surge voltage in this state, the first ESD protection circuit ESD1 operates as follows. Specifically, due to the surge voltage, if a forward bias larger in absolute value than its own gate threshold voltage Vthp is applied between the gate and source of the PMOS transistor QP provided in the first ESD protection circuit ESD1, the PMOS transistor QP is turned on. Then, a trigger is inputted from the PMOS transistor QP into the SCR of the first ESD protection circuit ESD1. As a consequence, the SCR is turned on and discharges the surge current, thereby protecting the internal circuit 10.

When the signal pad 15 receives a negative surge voltage or the VDD1 pad 11 receives a positive surge voltage, the second ESD protection circuit ESD2 operates as follows. Specifically, due to the surge voltage, if a forward bias larger in absolute value than its own gate threshold voltage Vthp is applied between the gate and source of the PMOS transistor QP provided in the second ESD protection circuit ESD2, the PMOS transistor QP is turned on. Then, a trigger is inputted from the PMOS transistor QP into the SCR of the second ESD protection circuit ES2. As a consequence, the SCR is turned on and discharges the surge current, thereby protecting the internal circuit 10.

When the VDD1 pad 11 receives a positive surge voltage, a trigger is inputted into each of the SCRs of the third ESD protection circuit ESD3 and fourth ESD protection circuit ESD4. As a consequence, each of the SCRs is turned on and discharges the surge current, thereby protecting the circuit between the VDD1 pad 11 and GND.

When the VDD2 pad 12 receives a positive surge voltage, a trigger is inputted into the SCR of the fifth ESD protection circuit ESD5. As a consequence, the SCR is turned on and discharges the surge current, thereby protecting the circuit between the VDD2 pad 12 and GND.

When the VDD3 pad 13 receives a positive surge voltage, a trigger is inputted into the SCR of the seventh ESD protection circuit ESD7. As a consequence, the SCR is turned on and discharges the surge current, thereby protecting the circuit between the VDD3 pad 13 and GND.

In the operation described above, the triggered SCR maintains the on-state by the agency of its positive feedback action. Accordingly, the PMOS transistor QP for inputting a trigger needs to be in the on-state only for a short time from immediately after a surge input until the SCR is triggered. In addition, since the PMOS transistor QP for inputting a trigger has a gate threshold voltage Vthp with a small absolute value, the SCR can be activated with a low voltage trigger.

FIRST EMBODIMENT

FIG. 2 is an equivalent circuit diagram showing a protection circuit section according to an embodiment of the present invention, which corresponds to the first ESD protection circuit ESD1 shown in FIG. 1. As described, a VDD1 pad 11, input pad 15, and GND pad 14 are pads electrically separated from each other.

The protection circuit section shown in FIG. 2 has an SCR for ESD protection, whose current passage between the anode and cathode is connected between the input pad 15, which is connected to, e.g., the input circuit 10 of an CMOS-LSI, and the GND pad 14. The SCR includes a PNP transistor Q5 and NPN transistor Q6 combined to equivalently form a thyristor. Specifically, the base and collector of the PNP transistor Q5 are connected to the collector and base of the NPN transistor Q6, respectively. The emitter of the PNP transistor Q5 comes to the anode, and the emitter of the NPN transistor Q6 comes to the cathode. A substrate resistance Rsub exists between the base of the NPN transistor Q6 and the GND.

The current passage between the source S and drain D of a PMOS transistor QP for inputting a trigger is connected between the input pad 15 and the base of the NPN transistor Q6. The gate G of the PMOS transistor QP is connected to the VDD1 pad 11. The substrate region (channel region) of the PMOS transistor QP is connected to the source S. A diode (D shown in FIG. 1) is connected in parallel with the SCR, and functions as a rectifier that receives a forward bias, when the SCR receives a reverse voltage.

In the arrangement described above, when an inputted surge voltage has to be handled, the VDD1 pad 11 is not yet supplied with a normal power supply potential VDD1, but the gate of the PMOS transistor QP for inputting a trigger is set at GND. When the input pad 15 receives a positive surge voltage in this state, the protection circuit section shown in FIG. 2 operates as follows.

Specifically, due to the surge voltage, if a forward bias larger in absolute value than its own gate threshold voltage Vthp is applied between the gate and source of the PMOS transistor QP, the PMOS transistor QP is turned on. Then, a trigger is inputted from the PMOS transistor QP into the SCR. As a consequence, the SCR is turned on and discharges the surge current to the GND, thereby protecting the input gate of the input circuit 10. In this case, since the PMOS transistor QP has a gate threshold voltage Vthp with a small absolute value, the SCR can be activated with a low voltage trigger.

Figure 3:
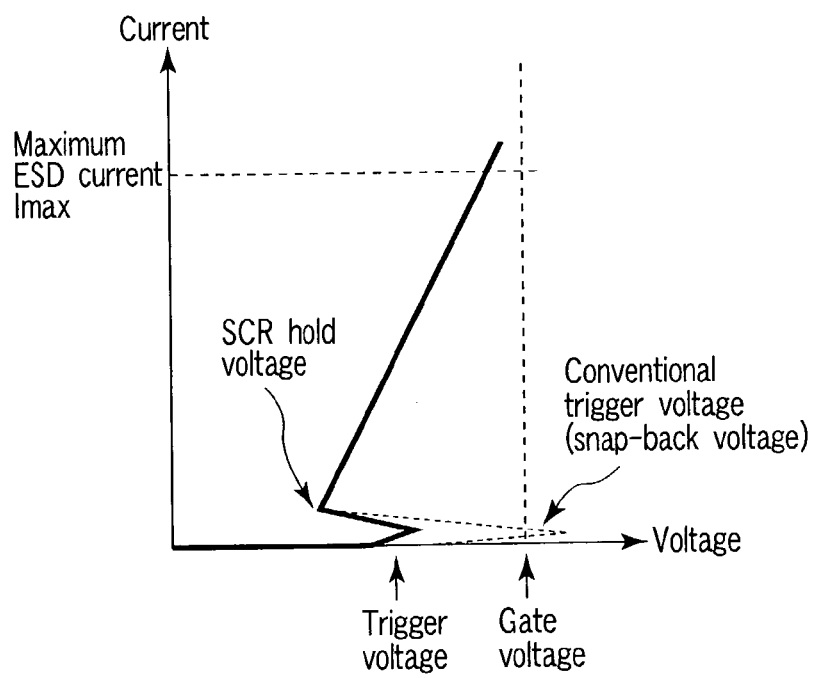
FIG. 3 is a characteristic diagram schematically showing the voltage-current characteristic of the SCR shown in FIG. 1.

FIG. 3 is a characteristic diagram schematically showing the voltage-current characteristic of the SCR shown in FIG. 1. This characteristic diagram shows a manner in which an ESD current flows when a trigger voltage is inputted with a value within a range higher than the hold voltage of the SCR, but lower than the breakdown voltage of the SCR.

(Modification 1 of the First Embodiment)

Figure 4:
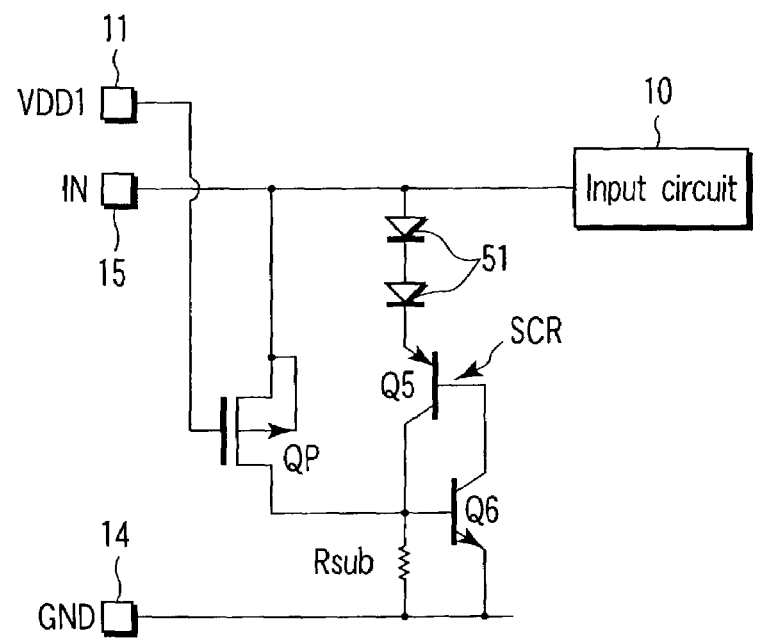
FIG. 4 is an equivalent circuit diagram showing a modification of the protection circuit section shown in FIG. 2.

FIG. 4 is an equivalent circuit diagram showing a modification of the protection circuit section shown in FIG. 2. The protection circuit section shown in FIG. 4 has a plurality of voltage drop elements 51 connected in series between an input pad 15 and the anode of an SCR. However, only one voltage drop element 51 need be connected between the input pad 15 and the anode of the SCR.

The voltage drop elements 51 are added to the protection circuit section shown in FIG. 2, to adjust the hold voltage of the SCR. Each of the voltage drop elements 51 is formed of, e.g., a diode, or an NMOS transistor whose drain and gate are connected to each other. In this case, the trigger voltage can be adjusted by connecting the source of the PMOS transistor QP to an intermediate connection node of the diodes 51 connected in series. The trigger voltage can also be adjusted by changing the size (W/L) or threshold of the PMOS transistor QP, or changing the number of the voltage drop elements 51 connected in series.

(Modification 2 of the First Embodiment)

Figure 5:
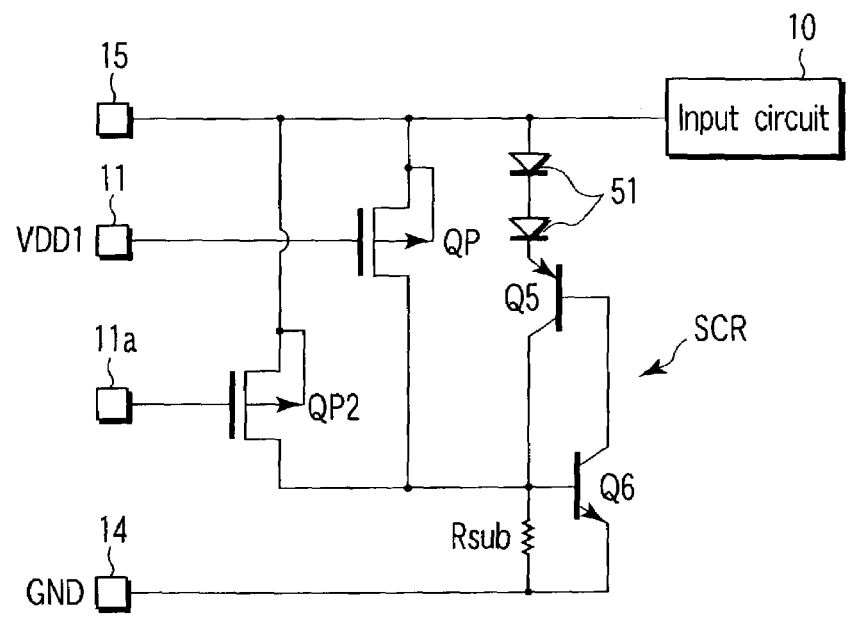
FIG. 5 is an equivalent circuit diagram showing a modification of the protection circuit section shown in FIG. 4.

FIG. 5 is an equivalent circuit diagram showing a modification of the protection circuit section shown in FIG. 4. The protection circuit section shown in FIG. 5 differs from the protection circuit section shown in FIG. 4 in the following points (1) and (2).

(1) A second PMOS transistor QP2 for inputting a trigger is additionally connected between an input pad 15 and the base of the NPN transistor Q6 of an SCR.

(2) The gate of the second PMOS transistor QP2 is connected to a power supply pad 11a other than a VDD1 pad 11 (which the gate of a first PMOS transistor QP is connected to). The power supply pad 11a is a pad electrically separated from the VDD1 pad 11, input pad 15, and GND pad 14. The power supply pad 11a is to be connected to a power supply terminal different from a power supply terminal connected to the VDD1 pad 11 in the normal operation.

In the arrangement described above, when an inputted surge voltage has to be handled, the VDD1 pad 11 and power supply pad 11a are not yet supplied with normal power supply potentials, but are set at GND. When the input pad 15 receives a positive surge voltage in this state, the protection circuit section shown in FIG. 5 operates as follows.

Specifically, due to the surge voltage, if a forward bias larger in absolute value than its own gate threshold voltage Vthp is applied between the gate and source of at least one of the two transistors QP and QP2, the corresponding PMOS transistor QP or QP2 is turned on. Then, a trigger is inputted from the turned-on PMOS transistor QP or QP2 into the SCR. As a consequence, the SCR is turned on and discharges the surge current to the GND, thereby protecting the input gate of the input circuit 10.

(Modification 3 of the First Embodiment)

Figure 6A:
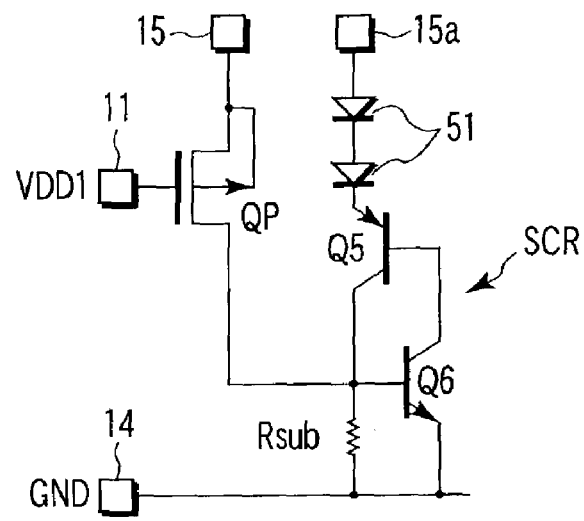
FIG. 6A is an equivalent circuit diagram showing another modification of the protection circuit section shown in FIG. 4.

FIG. 6A is an equivalent circuit diagram showing another modification of the protection circuit section shown in FIG. 4. The protection circuit section shown in FIG. 6A includes an SCR connected to a node 15a other than an input pad 15 in the same semiconductor circuit system. The node 15a is a node electrically separated at least from a VDD1 pad 11, and GND pad 14.

In the arrangement described above, when an inputted surge voltage has to be handled, the VDD1 pad 11 is not yet supplied with a normal power supply potential, but is set at GND. When the input pad 15 receives a positive surge voltage in this state, the protection circuit section shown in FIG. 6A operates as follows.

Specifically, due to the surge voltage, if a forward bias larger in absolute value than its own gate threshold voltage Vthp is applied between the gate and source of the PMOS transistor QP, the PMOS transistor QP is turned on. Then, a trigger is inputted from the PMOS transistor QP into the SCR. As a consequence, the SCR is turned on and discharges the surge current on the node 15a side to the GND, thereby protecting a protection target connected to the node 15a. Where the node 15a is on the discharge route, the SCR is turned on in advance, immediately after the input pad 15 receives the surge, thereby quickly forming the discharge route.

Figure 6B:
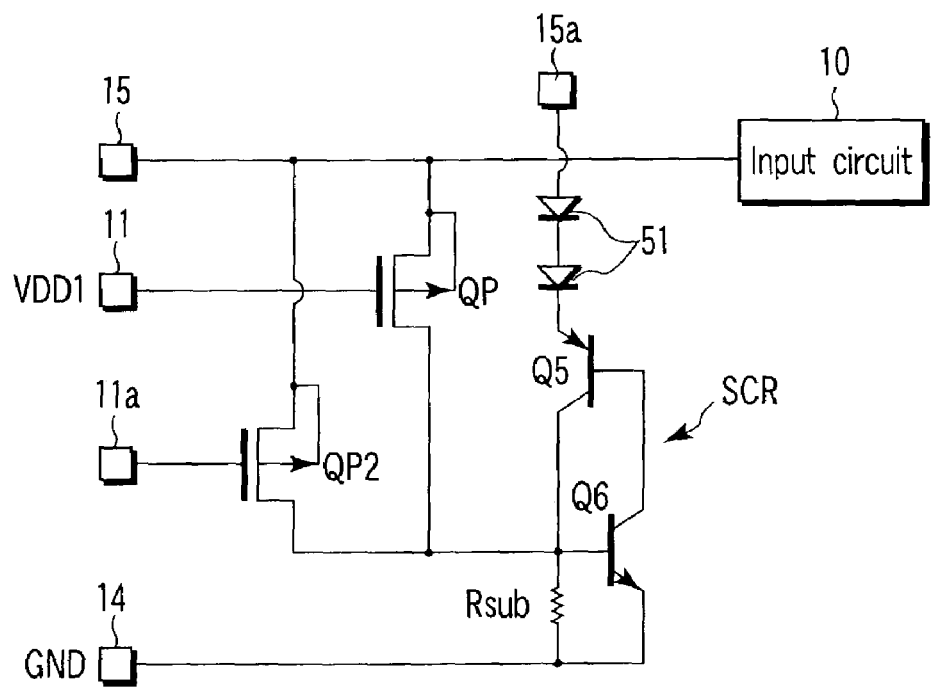
FIG. 6B is an equivalent circuit diagram showing still another modification of the protection circuit section shown in FIG. 4.

FIG. 6B is an equivalent circuit diagram showing a protection circuit section, which is formed by combining some features of the protection circuit sections shown in FIGS. 5 and 6A. The protection circuit section shown in FIG. 6B includes an SCR connected to a node 15a other than an input pad 15 in the same semiconductor circuit system. The node 15a is a node electrically separated at least from a VDD1 pad 11, power supply pad 11a, and GND pad 14.

In the arrangement described above, when an inputted surge voltage has to be handled, the VDD1 pad 11 and power supply pad 11a are not yet supplied with normal power supply potentials, but are set at GND. When the input pad 15 receives a positive surge voltage in this state, the protection circuit section shown in FIG. 6 operates as follows.

Specifically, due to the surge voltage, if a forward bias larger in absolute value than its own gate threshold voltage Vthp is applied between the gate and source of at least one of the two transistors QP and QP2, the corresponding PMOS transistor QP or QP2 is turned on. Then, a trigger is inputted from the turned-on PMOS transistor QP or QP2 into the SCR. As a consequence, the SCR is turned on and discharges the surge current on the node 15a side to the GND, thereby swiftly protecting a protection target connected to the node 15a.

(Modification 4 of the First Embodiment)

FIG. 7 is an equivalent circuit diagram showing still another modification of the protection circuit section shown in FIG. 4. The protection circuit section shown in FIG. 7 differs from the protection circuit section shown in FIG. 4 in the following points (1) to (4). It should be noted that the relationship between an ESD protection circuit ESD1 and another ESD protection circuit ESDX in this modification corresponds to the relationship between the ESD protection circuit ESD1 and ESD protection circuit ESD6 shown in FIG. 1.

(1) A second PMOS transistor QP2 for inputting a trigger is additionally connected between a node 15a other than an input pad 15 and the base of the NPN transistor Q6 of an SCR provided in the first ESD protection circuit ESD1.

(2) The gate of the second PMOS transistor QP2 is connected to a power supply pad 11a other than a VDD1 pad 11 (which the gate of a first PMOS transistor QP is connected to).

(3) An SCR2 provided in an ESD protection circuit ESDX other than the SCR of the first ESD protection circuit ESD1 is connected to a node 15b other than the input pad 15 in the same semiconductor circuit system. The node 15b is a node electrically separated at least from the VDD1 pad 11, power supply pad 11a, and GND pad 14.

(4) The interconnection point between the drains of the two PMOS transistors QP and QP2 is connected to the base of the NPN transistor Q6 of the SCR2 provided in the ESD protection circuit ESDX.

In the arrangement described above, when an inputted surge voltage has to be handled, the VDD1 pad 11 and power supply pad 11a are not yet supplied with normal power supply potentials, but are set at GND.

When the first input pad 15 receives a positive surge voltage in this state, the protection circuit section shown in FIG. 7 operates as follows. Specifically, due to the surge voltage, if a forward bias larger in absolute value than its own gate threshold voltage Vthp is applied between the gate and source of the first PMOS transistor QP, the PMOS transistor QP is turned on. Then, a trigger is inputted from the PMOS transistor QP into the SCR of the first ESD protection circuit ESD1. As a consequence, the SCR is turned on and discharges the surge current to the GND, thereby protecting a circuit connected to the first input pad 15.

When the second input pad 15a receives a positive surge voltage, the protection circuit section shown in FIG. 7 operates as follows. Specifically, due to the surge voltage, if a forward bias larger in absolute value than its own gate threshold voltage Vthp is applied between the gate and source of the second PMOS transistor QPw, the PMOS transistor QP2 is turned on. Then, a trigger is inputted from the PMOS transistor QP2 into the SCR of the first ESD protection circuit ESD1. As a consequence, the SCR is turned on and discharges the surge current to the GND, thereby protecting a circuit connected to the first input pad 15.

When the first PMOS transistor QP or second PMOS transistor QP2 is turned on, a trigger is also inputted into the SCR2 of the other ESD protection circuit ESDX through a trigger supply line 17. As a consequence, the SCR2 is turned on and discharges the surge current on the node 15b side to the GND, thereby protecting a protection target connected to the node 15b in advance.

(Modification 5 of the First Embodiment)

FIG. 8A is an equivalent circuit diagram showing still another modification of the protection circuit section shown in FIG. 4. In an LSI employing a plurality of power supplies, there is a difference in rising time of the power supply potentials, when the power supplies are being turned on. It is assumed that the protection circuit section shown in FIG. 4 is applied to an ESD protection circuit connected to a power supply whose power supply potential rises faster. In this case, if the power supply potential on a power supply pad connected to the gate of the PMOS transistor QP does not sufficiently rise, the PMOS transistor QP may be turned on. As a consequence, a trigger is unnecessarily inputted into the SCR. The protection circuit section shown in FIG. 8A solves this problem.

The protection circuit section shown in FIG. 8A differs from the protection circuit section shown in FIG. 4 in the following points (1) and (2).

(1) A plurality of (three in this embodiment) PMOS transistors QP for SCR trigger are connected between an input pad 15 and the base of the NPN transistor of an SCR. The PMOS transistors QP are connected such that their current passages between the source and drain are in series. The substrate region (channel region) of each of the three PMOS transistors QP is connected to the input pad 15.

(2) The gates of the three PMOS transistor QP are connected to a VDD1 pad 11, VDD2 pad 12, and VDD3 pad 13, respectively. The VDD1 pad 11, VDD2 pad 12, and VDD3 pad 13 are to be connected to power supply terminals VDD1, VDD2, and VDD3, respectively, different from each other, in the normal operation.

In the protection circuit section shown in FIG. 8A, the three PMOS transistors QP are connected to form a logical product (AND), so that the ESD protection is performed only when all the three pads, i.e., the VDD1 pad 11, VDD2 pad 12, and VDD3 pad 13, are set at GND. Accordingly, even in a transitional state with the power supplies being turned on, if one of the VDD1 pad 11, VDD2 pad 12, and VDD3 pad 13 reaches a predetermined potential and thus the corresponding one of the three PMOS transistors QP is turned off, a trigger is prevented from been inputted into the SCR. As a consequence, it is possible to prevent a malfunction of the ESD protection circuit when the power supplies are being turned on or a specific power supply is in the off-state.

The protection circuit section shown in FIG. 8A may be modified such that the plurality of PMOS transistors QP for inputting a trigger connected in series are used along with a PMOS transistor QP2 for inputting a trigger, which is connected to form a logical sum (OR), as in the protection circuit section shown in FIG. 5. This arrangement can produce the effects of both the protection circuit sections shown in FIGS. 5 and 8A. Furthermore, a series connection and parallel connection of a plurality of PMOS transistors QP for inputting a trigger may be combined to form a logic circuit for inputting a trigger.

FIG. 8B is an equivalent circuit diagram showing a protection circuit section, which is formed by combining some features of the protection circuit sections shown in FIGS. 6A and 8A. The protection circuit section shown in FIG. 8B includes an SCR connected to a node 15a other than an input pad 15 in the same semiconductor circuit system.

The node 15a is a node electrically separated at least from a VDD1 pad 11, VDD2 pad 12, VDD3 pad 13, and GND pad 14.

In the protection circuit section shown in FIG. 8B, when the input pad 15 receives a surge voltage, the SCR is turned on and discharges the surge current on the node 15a side to the GND, thereby protecting a protection target connected to the node 15a in advance.

SECOND EMBODIMENT

ESD protection circuits may be utilized not only to protect an input circuit or output circuit, but also to clamp the potential between power supplies to protect a current itself between the power supplies. As an example of this concept, an explanation will be given of a second embodiment in which a plurality of power supply routes are respectively provided with ESD protection circuits in a CMOS-LSI.

FIG. 9 is an equivalent circuit diagram showing the fourth ESD protection circuit ESD4 and the fifth ESD protection circuit ESD5 along with diodes for allowing a current to flow in the reverse direction, which are shown in FIG. 1. As shown in FIG. 9, the fourth ESD protection circuit ESD4 and a diode combination for allowing a current to flow in the reverse direction is connected between a VDD1 pad 11 and GND pad 14. Similarly, the fifth ESD protection circuit ESD5 and a diode combination for allowing a current to flow in the reverse direction is connected between a VDD2 pad 12 separated from a VDD1 pad 11, and the GND pad 14. The gate of a PMOS transistor QP for inputting a trigger, provided in the fourth ESD protection circuit ESD4, is electrically connected to the VDD2 pad 12. The gate of a PMOS transistor QP for inputting a trigger, provided in the fifth ESD protection circuit ESD5, is electrically connected to the VDD1 pad 11.

Also in this arrangement, as in the first embodiment, when an inputted surge voltage has to be handled by the ESD protection circuit, the VDD1 pad 11 and VDD2 pad 12 are not yet supplied with normal power supply potentials, but are set at GND in general. Accordingly, when one of the VDD1 pad 11 and VDD2 pad 12 receives an ESD, since reference is made to the gates of the PMOS transistors QP set at GND, the PMOS transistors QP for inputting a trigger are turned on with a low trigger voltage, and triggers are respectively inputted into the SCRs. As the power supply terminals are mutually referred to, the SCRs are turned on and discharge the surge current, thereby protecting the circuit between the VDD1 pad 11 and GND and the circuit between the VDD2 pad 12 and GND.

Each SCR thus triggered maintains the on-state by the agency of its positive feedback action. Accordingly, each PMOS transistor QP for inputting a trigger needs to be in the on-state only for a short time from immediately after a surge input until the SCR is triggered. In the normal operation, both the PMOS transistors QP are turned off, when the VDD1 pad 11 or VDD2 pad 12 is supplied with VDD1 or VDD2, thereby not disturbing the normal operation.

THIRD EMBODIMENT

Figure 10:
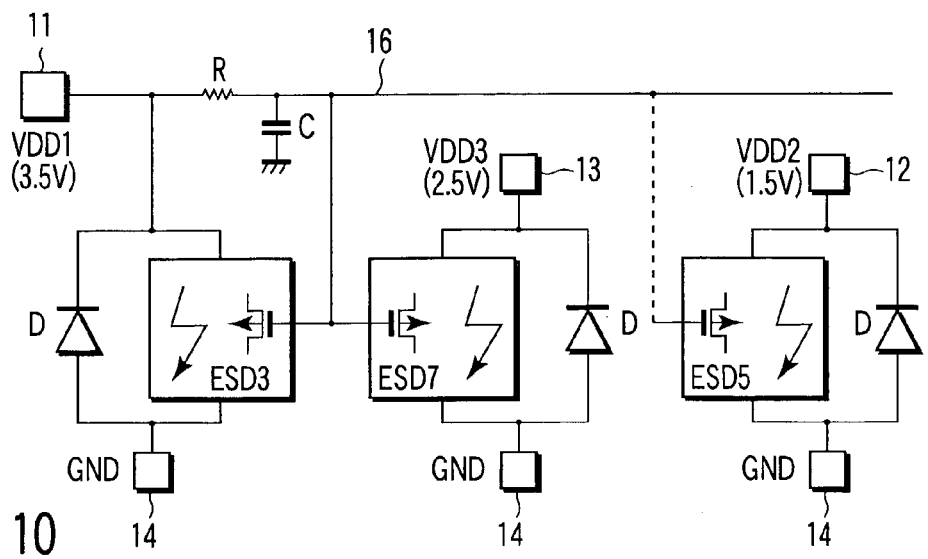
FIG. 10 is an equivalent circuit diagram showing the third ESD protection circuit ESD3, the seventh ESD protection circuit ESD7, and its trigger bias circuit, along with diodes for allowing a current to flow in the reverse direction, which are shown in FIG. 1.

FIG. 10 is an equivalent circuit diagram showing the third ESD protection circuit ESD3, the seventh ESD protection circuit ESD7, and its trigger bias circuit, along with diodes for allowing a current to flow in the reverse direction, which are shown in FIG. 1.

As shown in FIG. 10, the gate of the PMOS transistor QP for inputting a trigger, provided in each of these ESD protection circuits is connected to the output node of an RC integrator circuit through a trigger bias line 16. The RC integrator circuit is arranged such that a resistance element R and capacitance element C are connected in series between the highest potential power supply pad (VDD1 pad 11) and GND pad 14.

In the arrangement described above, when an inputted surge voltage has to be handled by the ESD protection circuit, the trigger bias line 16 is set at GND. When the VDD1 pad 11 receives a positive surge voltage in this state, if a forward bias larger in absolute value than its own gate threshold voltage Vthp is applied between the gate and source of the PMOS transistor QP, the PMOS transistor QP is turned on.

Then, a trigger is inputted from the PMOS transistor QP into the SCR. As a consequence, the SCR is turned on and discharges the surge current, thereby protecting the circuit between the VDD1 pad 11 and GND or the circuit between the VDD3 pad 13 and GND. Since the power supply rises up slowly in the normal operation, the PMOS transistor QP is turned off when the potential of the trigger bias line 16 is increased while no integration action of the RC integrator circuit takes place. In other words, since an ESD input is instantaneous, operational switching is performed with a time constant.

As shown with a broken line in FIG. 10, the trigger bias line 16 may be connected to the gate of the PMOS transistor QP for inputting a trigger, provided in the fifth ESD protection circuit ESD5 shown in FIG. 1. In this case, as described above, when the VDD1 pad 11 receives a positive surge voltage, this PMOS transistor QP is also turned on, thereby protecting the circuit between the VDD2 pad 12 and GND.

FOURTH EMBODIMENT

The fourth embodiment relates to the first ESD protection circuit ESD1, fourth ESD protection circuit ESD4, and sixth ESD protection circuit ESD6, which belong to one surge current route shown in FIG. 1.

The sixth ESD protection circuit ESD6 has an SCR connected through a trigger supply line 17 to a PMOS transistor QP for inputting a trigger provided in the first ESD protection circuit ESD1, which belongs to the same surge current route as the ESD6. This manner is the same as the relationship of the ESD protection circuit ESDX relative to the ESD protection circuit ESD1, shown in FIG. 7.

In the arrangement described above, when an inputted surge voltage has to be handled by the ESD protection circuit, the VDD1 pad 11 is not yet supplied with a normal power supply potential, but is set at GND. When the input pad 15 receives a positive surge voltage relative to the potential of the VDD2 pad 12 in this state, the protection circuit section operates as follows.

Specifically, due to the surge voltage, if a forward bias larger in absolute value than its own gate threshold voltage Vthp is applied between the gate and source of the PMOS transistor QP provided in the first ESD protection circuit ESD1, the PMOS transistor QP is turned on. Then, a trigger is inputted from the PMOS transistor QP into the SCR of the first ESD protection circuit ESD1. As a consequence, the SCR is turned on and forms a discharge route to the GND for the surge current. In addition, when the PMOS transistor QP is turned on, a trigger is also inputted into the SCR of the sixth ESD protection circuit ESD6 through the trigger supply line 17. As a consequence, this SCR is also turned on and swiftly forms an ESD current route through the diode connected in parallel with the fourth ESD protection circuit ESD4 to the GND, to discharge the surge current.

At this time, the surge current flows from the input pad 15 to the VDD2 pad 12 via a route, which is first through the SCR of the first ESD protection circuit ESD1, then through the diode D connected in parallel with the fourth ESD protection circuit ESD4 for allowing a current to flow in the reverse direction, and then through the SCR of the sixth ESD protection circuit ESD6. As a consequence, the ESD protection circuits protect the circuit between the input circuit 10, VDD1 pad 11, and VDD2 pad 12.

As described above, after the PMOS transistor QP for inputting a trigger into the first ESD protection circuit ESD1 and sixth ESD protection circuit ESD6 is turned on, the PMOS transistor QP is turned off when the VDD1 pad 11 is supplied with a power supply potential.

FIFTH EMBODIMENT

Figure 11A:
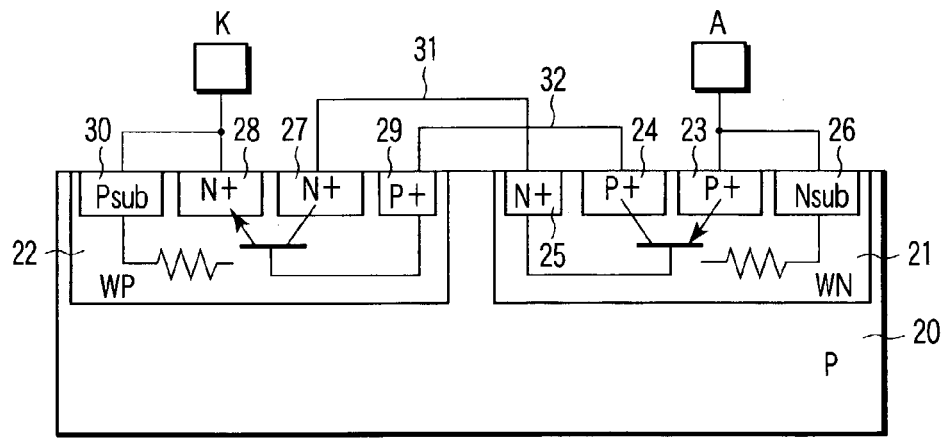
FIG. 11A is a sectional view schematically showing a sectional structure of the SCR shown in FIG. 2.

FIG. 11A is a sectional view schematically showing a sectional structure of the SCR shown in FIG. 2.

FIG. 12 is a plan view schematically showing an example of the plan view pattern of the SCR shown in FIG. 11A.

As shown in FIGS. 11 and 12, an N-well layer (WN) 21 and P-well layer (WP) 22 are formed in the surface of a P-substrate 20. In this case, the N-well layer 21 and P-well layer 22 are separated, but may be in contact with each other.

The N-well layer 21 works as the base region of the PNP transistor Q5. Two $P^+$-regions 23 and 24, $N^+$-region 25, and Nsub region 26 are formed in the surface of the N-well layer 21. Each of the $P^+$-regions 23 and 24 and $N^+$-region 25 has a large pattern area with a slim rectangular shape. The Nsub region 26 has a small pattern area. The $P^+$-region 23 works as the emitter region of the PNP transistor Q5. The $P^+$-region 24 works as the collector region of the PNP transistor Q5. The $N^+$-region 25 works as the base lead-out region of the PNP transistor Q5. The Nsub region 26 works as the lead-out region of the N-well layer. The Nsub region 26 and $P^+$-region 23 are connected each other and come to the anode (Anode) of the SCR.

On the other hand, the P-well layer 22 works as the base region of the NPN transistor Q6. Two $N^+$-regions 27 and 28, $P^+$-region 29, and Psub region 30 are formed in the surface of the P-well layer 22. Each of the $N^+$-regions 27 and 28 and $P^+$-region 29 has a large pattern area with a slim rectangular shape. The Psub region 30 has a small pattern area. The $N^+$-region 27 works as the collector region of the NPN transistor Q6. The $N^+$-region 28 works as the emitter region of the NPN transistor Q6. The $P^+$-region 29 works as the base lead-out region of the NPN transistor Q6. The Psub region 30 works as the lead-out region of the P-well layer. The Psub region 30 and $N^+$-region 27 are connected each other and come to the cathode (Cathode) of the SCR.

The $N^+$-region 25 formed in the N-well layer 21 and the $N^+$-region 27 formed in the P-well layer 22 are connected to each other by, e.g., three interconnection lines 31. Each of the interconnection lines 31 is formed of a metal layer consisting mainly of aluminum and disposed on the P-substrate 20 through an insulating layer (not shown). Similarly, the $P^+$-region 24 formed in the N-well layer 21 and the $P^+$-region 29 formed in the P-well layer 22 are connected to each other by, e.g., three metal interconnection lines 31, which are disposed on the P-substrate 20 through an insulating layer (not shown).

As is obvious from the equivalent circuit shown in FIG. 2, currents flow complementarily through the two current passages of the SCR (the passage including the metal interconnection lines 31 and the passage including the metal interconnection lines 32). Since the two current passages of the SCR are two-dimensionally arranged in the structure shown in FIGS. 11 and 12, it is proof against variations in, for example, current amplification rate of the PNP transistor and NPN transistor due to process variations.

The $N^+$-region 25 formed in the N-well layer 21 and the $P^+$-region 29 formed in the P-well layer 22 have the same pattern width (the longitudinal length of a slim rectangular shape shown in FIG. 12) as that of the $P^+$-region 23, $P^+$-region 24, $N^+$-region 27, and $N^+$-region 28. With this arrangement, the base resistance can be easily reduced.

Figure 11B:
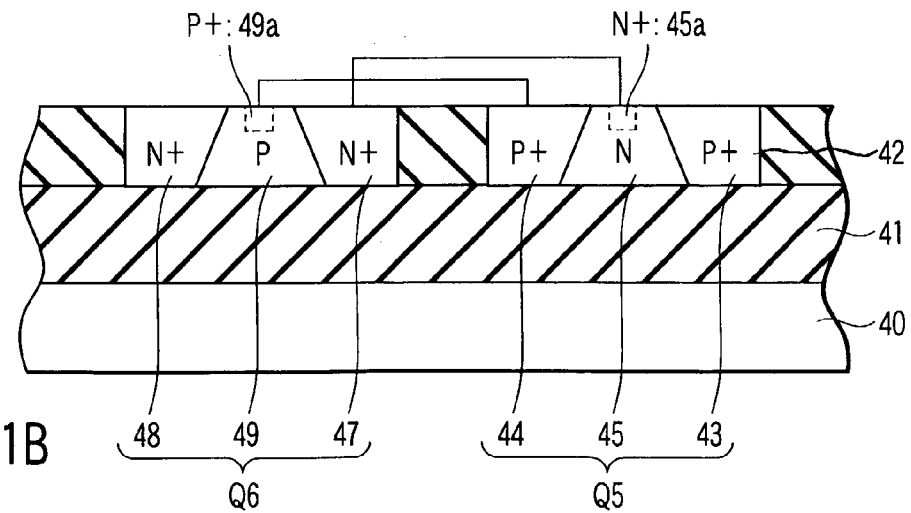
FIG. 11B is a sectional view schematically showing a modification of a sectional structure of the SCR shown in FIG. 2.

FIG. 11B is a sectional view schematically showing a modification of a sectional structure of the SCR shown in FIG. 2. As shown in FIG. 11B, the SCR may be realized on an SOI (Silicon On Insulator) substrate. Specifically, the SOI substrate has a semiconductor active layer 42 disposed on a semiconductor support layer 40 through an insulating layer 41. The PNP transistor Q5 (an emitter region 43, base region 45, and collector region 44) and the NPN transistor Q6 (a collector region 47, base region 49, and emitter region 48) are formed in the active layer 42. The base lead-out region 45a of the PNP transistor Q5 and the collector region 47 of the NPN transistor Q6 are connected to each other. The base lead-out region 49a of the NPN transistor Q6 and the collector region 44 of the PNP transistor Q5 are connected to each other. Similarly, the SCR shown FIG. 11A or 14 may be also realized on an SOI substrate.

SIXTH EMBODIMENT

In the SCR of the second ESD protection circuit ESD2 shown in FIG. 1, it is necessary to electrically separate the N-well layer and P-well layer from the P-substrate. For this, a deep N-well layer may be formed in the surface of the P-substrate, with the N-well layer and P-well layer of the SCR being formed in the deep N-well layer.

SEVENTH EMBODIMENT

Of the two current passages of the SCR explained with reference to FIG. 12, a current flows in one current passage (a current passage including the base of the PNP transistor Q5 and the collector of the NPN transistor Q6) more than in the other current passage (a current passage including the collector of the PNP transistor Q5 and the base of the NPN transistor Q6). It is thus preferable that, where a predominant current passage through which the main current flows is distinct, this current passage is optimized.

FIG. 13 is a plan view schematically showing a modification of the plan view pattern of the SCR shown in FIG. 12. In this plan view pattern, regions belonging to a predominant current passage have a pattern width larger than that of regions belonging to the other current passage. The regions belonging to a predominant current passage are an $N^+$-region (the base lead-out region of the PNP transistor Q5) 25 in an N-well layer 21, and two $N^+$-regions (the collector region and emitter region of the NPN transistor Q6) 27 and 28 in a P-well layer 22. The regions belonging to the other current passage are $P^+$-regions (the emitter region and collector region of the PNP transistor Q5) 23a and 24a in the N-well layer 21, and a $P^+$-region (the base lead-out region of the NPN transistor Q6) 29a in the P-well layer 22.

EIGHTH EMBODIMENT

Figure 15:
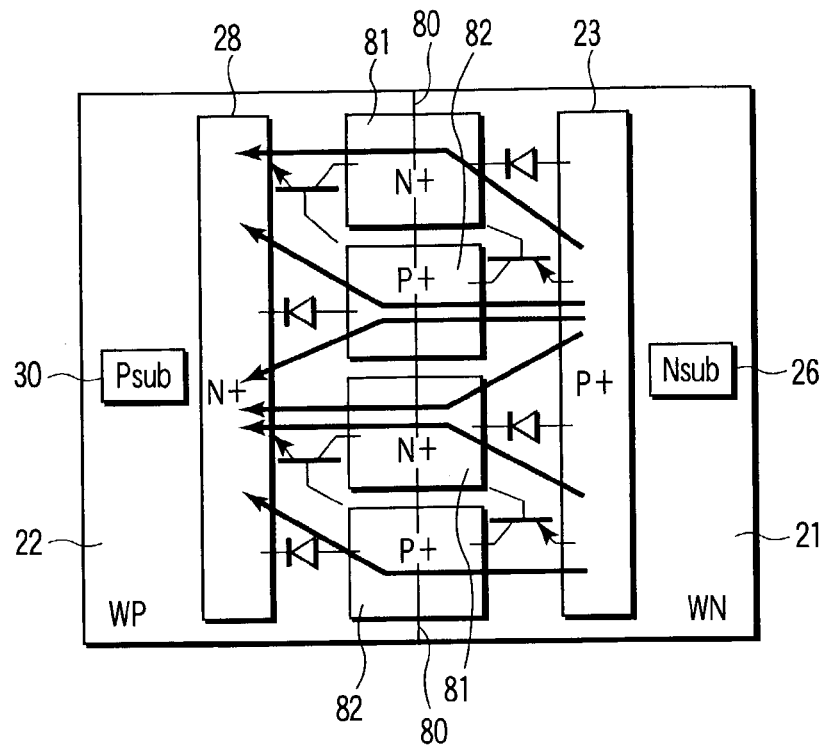
FIG. 15 is a plan view schematically showing an example of the plan view pattern of the SCR shown in FIG. 14.

FIG. 14 is a sectional view schematically showing a modification of the sectional structure of the SCR shown in FIG. 11A. FIG. 15 is a plan view schematically showing an example of the plan view pattern of the SCR shown in FIG. 14.

The sectional structure shown in FIG. 14 differs in the following points (1) and (2) from the sectional structure of the SCR described above with reference to FIG. 11A.

(1) An N-well layer 21 and P-well layer 22 are in contact with each other at an interface 80.

(2) In the surface of the N-well layer 21 and P-well layer 22, which includes the interface 80, a plurality of $N^+$-regions 81 and a plurality of $P^+$-regions 82, each of which has, e.g. a square shape, are alternately formed along the interface 80. The $N^+$-regions 81 work as the base lead-out region of the PNP transistor Q5 and the collector region of the NPN transistor Q6. The $P^+$-regions 82 work as the collector region of the PNP transistor Q5 and the base lead-out region of the NPN transistor Q6.

A $P^+$-region (the emitter region of the PNP transistor Q5) 23 formed in the N-well layer 21, and an $N^+$-region (the emitter region of the NPN transistor Q6) 28 formed in the P-well layer 22 have a large pattern area with a slim rectangular shape.

In the structure shown in FIGS. 14 and 15, the common $N^+$-regions 81 are formed in the surface including the interface 80, such that the base lead-out region of the PNP transistor Q5 and the collector region of the NPN transistor Q6 are owned in common. Furthermore, the common $P^+$-regions 82 are formed in the surface including the interface 80, such that the collector region of the PNP transistor Q5 and the base lead-out region of the NPN transistor Q6 are owned in common. As a consequence, the restriction against current is relaxed, thereby allowing a larger current to flow, as compared to a case where the metal interconnection lines 31 and 32 are inserted in the current passage.

NINTH EMBODIMENT

In the eighth embodiment, where a predominant current passage through which the main current flows is distinct, this current passage may be optimized, as in the seventh embodiment.

Figure 16:
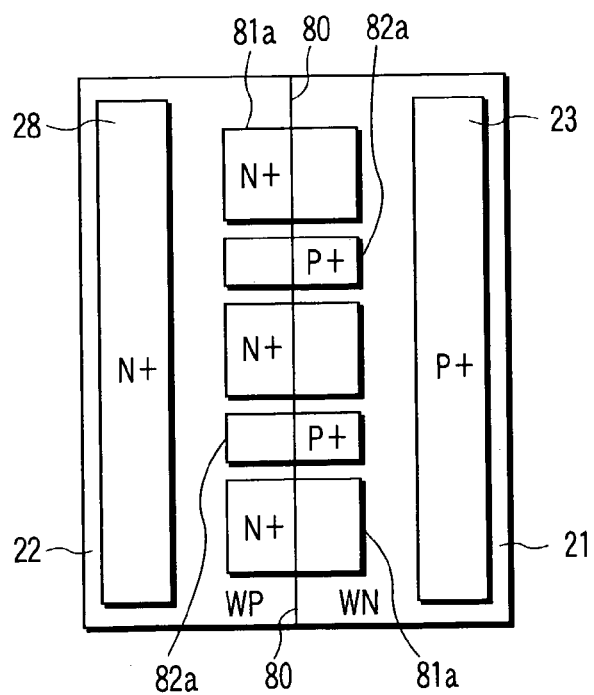
FIG. 16 is a plan view schematically showing a part of a modification of the plan view pattern shown in FIG. 15.
Figure 17:
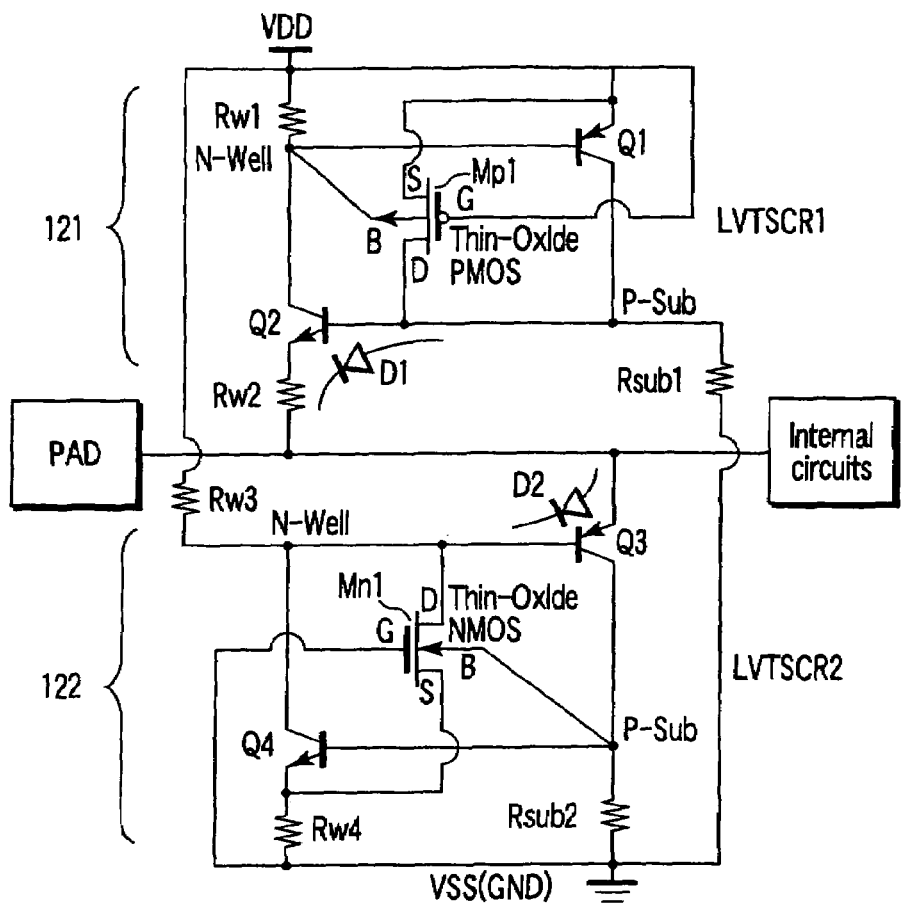
FIG. 17 is an equivalent circuit diagram of a conventional ESD protection circuit employing an SCR and connected to the input circuit of a CMOS-LSI.
Figure 18:
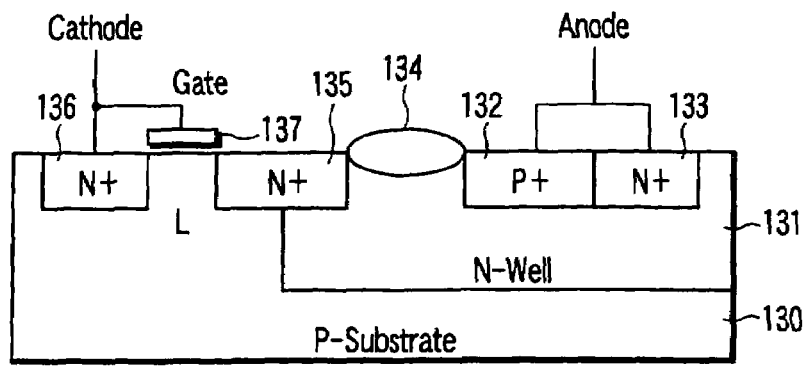
FIG. 18 is a sectional view schematically showing the LVTSCR2 shown in FIG. 17 as a representative.
Figure 19:
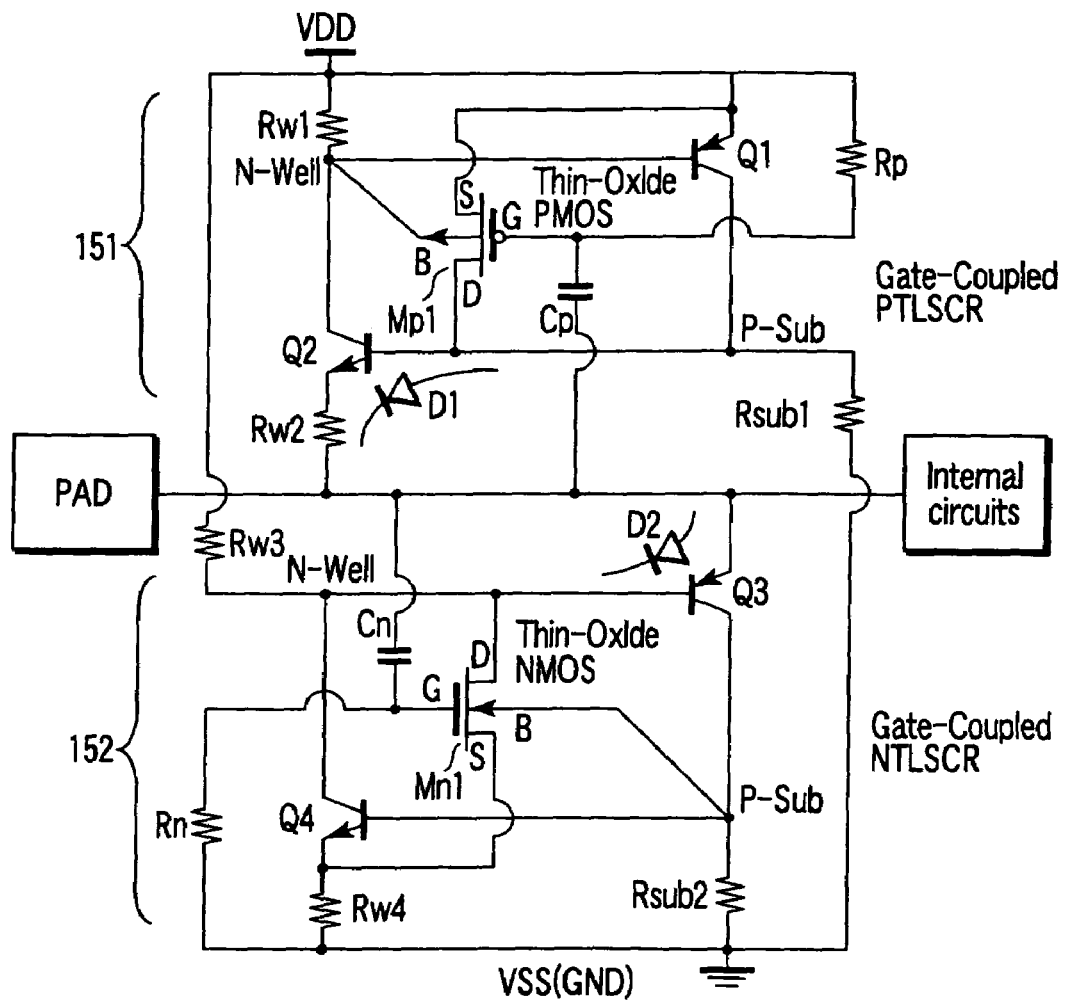
FIG. 19 is an equivalent circuit diagram of another conventional ESD protection circuit employing an SCR and connected to the input circuit of a CMOS-LSI.

FIG. 16 is a plan view schematically showing a part of a modification of the plan view pattern shown in FIG. 15. This plan view pattern differs from the plan view pattern shown in FIG. 15, in that, although $N^+$-regions 81a and $P^+$-regions 82a are also formed in the surface of an N-well layer 21 and P-well layer 22, which includes an interface 80, the pattern width of the $N^+$-regions 81a belonging to the predominant current passage is set larger than the $P^+$-regions 82a belonging to the other current passage. With this arrangement, it is possible to obtain substantially the same effect as the SCR according to the seventh embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A protection circuit section provided in a semiconductor circuit system, which has first, second, and third external terminals electrically separated from each other, the first external terminal being configured to receive a first power supply voltage in a normal operation, the protection circuit section comprising:

a rectifier configured to allow a surge current to pass therethrough, the rectifier including a PNP transistor and an NPN transistor combined to equivalently form a thyristor, and the rectifier having a first current passage connected between a specific terminal connected to a protection target and the third external terminal; and a first PMOS transistor configured to trigger the rectifier, based on a surge voltage inputted into the second external terminal, the first PMOS transistor having a second current passage connected between the second external terminal and a base of the NPN transistor, the first PMOS transistor having a source and a channel region connected to each other, and the first PMOS transistor having a gate connected to the first external terminal, wherein the semiconductor circuit system further has a fourth external terminal electrically separated from the first and third external terminals, and a fifth external terminal electrically separated from the first, second, third, and fourth external terminals, the fifth external terminal being configured to receive a second power supply voltage in the normal operation, and wherein the protection circuit section further comprises a second PMOS transistor configured to trigger the rectifier, based on a second surge voltage inputted into the fourth external terminal, the second PMOS transistor having a third current passage connected between the fourth external terminal and the base of the NPN transistor, the second PMOS transistor having a source and a channel region connected to each other, and the second PMOS transistor having a gate connected to the fifth external terminal, and wherein the semiconductor circuit system further has a sixth external terminal electrically separated from the first, third, and fifth external terminals, and the specific terminal is the sixth external terminal.

2. The protection circuit section according to claim 1, further comprising a voltage drop element configured to set a hold voltage of the rectifier and connected between the second external terminal and the rectifier.

3. The protection circuit section according to claim 1, further comprising a rectifying member configured to allow a current to pass therethrough in reverse to the rectifier, and connected in parallel with the rectifier.

4. A protection circuit section provided in a semiconductor circuit system, which has first, second, and third external terminals electrically separated from each other, the first external terminal being configured to receive a first power supply voltage in a normal operation, the protection circuit section comprising:

a rectifier configured to allow a surge current to pass therethrough, the rectifier including a PNP transistor and an NPN transistor combined to equivalently form a thyristor, and the rectifier having a first current passage connected between a specific terminal connected to a protection target and the third external terminal; and a first PMOS transistor configured to trigger the rectifier, based on a surge voltage inputted into the second external terminal, the first PMOS transistor having a second current passage connected between the second external terminal and a base of the NPN transistor, the first PMOS transistor having a source and a channel region connected to each other, and the first PMOS transistor having a gate connected to the first external terminal, wherein the semiconductor circuit system further has a fourth external terminal electrically separated from the first, second, and third external terminals, the fourth external terminal being configured to receive a second power supply voltage in the normal operation, and wherein the protection circuit section further comprises a second PMOS transistor configured to trigger the rectifier, based on a surge voltage inputted into the second external terminal, the second PMOS transistor having a third current passage connected between the second current passage of the first PMOS transistor and the base of the NPN transistor, and the second PMOS transistor having a gate connected to the fourth external terminal, wherein the semiconductor circuit system further has a fifth external terminal electrically separated from the first, third, and fourth external terminals, and the specific terminal is the fifth external terminal.

5. The protection circuit according to claim 4, further comprising a voltage drop element configured to set a hold voltage of the rectifier and connected between the second external terminal and the rectifier.

6. The protection circuit according to claim 4, further comprising a rectifying member configured to allow a current to pass therethrough in reverse to the rectifier, and connected in parallel with the rectifier.

7. A protection circuit section provided in a semiconductor circuit system, which has first, second, and third external terminals electrically separated from each other, the first external terminal being configured to receive a first power supply voltage in a normal operation, the protection circuit section comprising:

a rectifier configured to allow a surge current to pass therethrough, the rectifier including a PNP transistor and an NPN transistor combined to equivalently form a thyristor, and the rectifier having a first current passage connected between a specific terminal connected to a protection target and the third external terminal;

a first PMOS transistor configured to trigger the rectifier, based on a surge voltage inputted into the second external terminal, the first PMOS transistor having a second current passage connected between the second external terminal and a base of the NPN transistor, the first PMOS transistor having a source and a channel region connected to each other, and the first PMOS transistor having a gate connected to the first external terminal an N-well layer and a P-well layer formed in a surface of a semiconductor active layer;

a first $P^+$-region, a second $P^+$-region, and a first $N^+$-region formed in a surface of the N-well layer;

a second $N^+$-region, a third $N^+$-region, and a third $P^+$-region formed in a surface of the P-well layer;

a first interconnection line layer disposed on the active layer through a first insulating layer and connecting the first $N^+$-region and the second $N^+$-region to each other; and a second interconnection line layer disposed on the active layer through a second insulating layer and connecting the second P$^+$-region and the third P$^+$-region to each other;

wherein the PNP transistor is formed, using the N-well layer as a base region, the first P$^+$-region as a first emitter region, the second P$^+$-region as a first collector region, and the first N$^+$-region as a first base lead-out region, while the N-well layer and the first P$^+$-region are connected to each other, and wherein the NPN transistor is formed, using the P-well layer as a second base region, the second N$^+$-region as a second collector region, the third N$^+$-region as a second emitter region, and the third P$^+$-region as a second base lead-out region, while the P-well layer and the third N$^+$-region are connected to each other.

8. The protection circuit section according to claim 7, wherein the N-well layer and the P-well layer are separated from each other.

9. The protection circuit section according to claim 7, wherein the semiconductor active layer is disposed on a semiconductor support layer through an insulating layer.

10. The protection circuit section according to claim 7, wherein the first, second, and third N$^+$-regions have a pattern width larger than that of the second and third P$^+$-regions.

11. The protection circuit section according to claim 7, wherein the N-well layer and the P-well layer are in contact with each other through an interface, the first N$^+$-region and the second N$^+$-region comprise parts of a common N$^+$-region formed in the N-well layer and the P-well layer across the interface, and the second P$^+$-region and the third P$^+$-region comprise parts of a common P$^+$-region formed in the N-well layer and the P-well layer across the interface.

12. The protection circuit section according to claim 11, wherein the common N$^+$-region and the common P$^+$-region respectively comprise a plurality of common N$^+$-regions and a plurality of common P$^+$-regions, and the plurality of common N$^+$-region and the plurality of common P$^+$-region are alternately disposed.

13. The protection circuit section according to claim 11, wherein the common N$^+$-region has a pattern width larger than that of the common P$^+$-region.

* * * * *